United States Patent
Akram

[19]

[11] Patent Number: 6,140,160
[45] Date of Patent: Oct. 31, 2000

[54] METHOD FOR FABRICATING A SIMPLIFIED CMOS POLYSILICON THIN FILM TRANSISTOR AND RESULTING STRUCTURE

[75] Inventor: Salman Akram, Boise, Id.

[73] Assignee: Micron Technology, Inc., Boise, Id.

[21] Appl. No.: 08/900,906

[22] Filed: Jul. 28, 1997

[51] Int. Cl.[7] ............................................... H01L 21/00
[52] U.S. Cl. .................... 438/154; 438/149; 438/151; 438/197; 438/353; 438/355; 438/405; 438/412
[58] Field of Search .................................. 438/149, 151, 438/154, 197, 353, 355, 405, 412

[56] References Cited

U.S. PATENT DOCUMENTS

| | | | |
|---|---|---|---|
| 3,745,072 | 4/1970 | Scott, Jr. .................................. | 438/412 |
| 4,199,384 | 4/1980 | Hsu ......................................... | 438/412 |
| 5,028,564 | 7/1991 | Chang et al. ............................ | 438/412 |
| 5,208,476 | 5/1993 | Inoue . | |
| 5,499,124 | 3/1996 | Vu et al. .................................. | 359/59 |
| 5,504,020 | 4/1996 | Aomori et al. .......................... | 437/40 |
| 5,508,216 | 4/1996 | Inoue ...................................... | 437/40 |
| 5,508,227 | 4/1996 | Chan et al. .............................. | 437/172 |
| 5,510,278 | 4/1996 | Nguyen et al. .......................... | 437/40 |
| 5,510,748 | 4/1996 | Erhart et al. ............................ | 327/530 |
| 5,514,618 | 5/1996 | Hunter, Jr. et al. ...................... | 437/60 |
| 5,514,879 | 5/1996 | Yamazaki ................................ | 257/65 |
| 5,521,107 | 5/1996 | Yamazaki et al. ...................... | 437/42 |
| 5,528,056 | 6/1996 | Shimada et al. ........................ | 257/72 |
| 5,528,397 | 6/1996 | Zavracky et al. ....................... | 359/59 |
| 5,606,179 | 2/1997 | Yamazaki et al. . | |
| 5,719,429 | 2/1998 | Iwamatsu et al. ...................... | 257/349 |
| 5,801,080 | 9/1998 | Inoue et al. ............................. | 438/405 |
| 5,877,048 | 3/1999 | Wu .......................................... | 438/412 |
| 5,880,003 | 3/1999 | Hayashi .................................. | 438/405 |
| 5,882,981 | 3/1999 | Rajgopal et al. ....................... | 438/412 |

*Primary Examiner*—John F. Niebling
*Assistant Examiner*—Lynne A. Gurley
*Attorney, Agent, or Firm*—Trask, Britt & Rossa

[57] ABSTRACT

A method of forming a MOS device using doped and activated n-type and p-type polysilicon layers wherein a first doped and activated polysilicon layer (either n-type and-p-type) is patterned on a substrate. An isolation material layer is formed abutting the first doped and activated polysilicon layer in the corners formed at the junction between the first doped and activated polysilicon layer and the substrate. A second doped and activated polysilicon layer (either n-type or p-type) is applied over the first doped and activated polysilicon layer and the isolation material layer. The second doped and activated polysilicon layer is planarized to the height of the first doped and activated polysilicon layer. The first and second doped and activated polysilicon layers are etched to substantially bifurcate the first and second doped and activated polysilicon layers. Further processing steps known in the art are utilized to complete the MOS device. The method of the present invention eliminates ion implantation and annealing steps used in present methods.

20 Claims, 15 Drawing Sheets

METHOD FOR FABRICATING A SIMPLIFIED CMOS POLYSILICON THIN FILM TRANSISTOR AND RESULTING STRUCTURE

BACKGROUND OF THE INVENTION

1. Field of the Invention

The present invention relates to a method for fabricating a Complementary Metal Oxide Semiconductor ("CMOS") Thin Film Transistor ("TFT"). More particularly, the present invention relates to fabricating a CMOS TFT with a simplified method which eliminates the ion implantation and annealing steps used in present methods.

2. State of the Art

The development of new portable electronic products, such as notebook computers and personal interface devices, is currently receiving a great deal of attention in the consumer products market. Substantial research and development have been focused in the field of active matrix liquid-crystal displays. Active matrix displays generally consist of flat panels of liquid crystals or electroluminescent materials which are switched "on" and "off" by electric fields. Every liquid crystal picture element ("pixel") is charged by thin film transistors ("TFTs"). One of the most common components in the circuit for the liquid crystal display is the inverter, which has a CMOS structure constructed with a pair of n-type and p-type TFTs.

Although both polysilicon and amorphous silicon may be used in the fabrication of TFTs, a polysilicon semiconductor layer generally provides greater mobility of electrons and holes than does amorphous silicon. Furthermore, the CMOS structure can be easier to construct with polysilicon since the n-type and p-type TFTs can be formed by the same implant and anneal process. The CMOS inverter constructed with polysilicon TFTs also offers excellent characteristics in terms of operating frequency and power consumption.

In the fabrication of a TFT, the semiconductor-layer source and drain regions are formed by introducing an impurity element into the semiconductor layer (see U.S. Pat. No. 5,514,879 issued May 7, 1996 to Yamazaki). The controlled introduction of impurities enable good transistor characteristics. Typically, the introduction of impurities for a CMOS TFT requires two masking and implantation steps. As shown in FIG. 26, a substrate 202 is coated with a layer of oxide 204. A non-doped polysilicon layer 206 is applied to the oxide layer 204, and a resist layer 208 is applied to the non-doped polysilicon layer 206 in a predetermined pattern. The non-doped polysilicon layer 206 is then etched to form a non-doped polysilicon ledge 210, as shown in FIG. 27. A portion of the non-doped polysilicon ledge 210 is masked with a first mask 212 and an n-type impurity is introduced into the unmasked portion of the non-doped polysilicon ledge 210 to form an n-type area 214, as shown in FIG. 28. The first mask 212 is removed and a second mask 216 is applied to the non-doped polysilicon ledge 210 so as to cover the n-type area 214 and a portion 220 of the non-doped polysilicon ledge 210. A p-type impurity is introduced to the unmasked portion of the non-doped polysilicon ledge 210 to form a p-type area 218, as shown in FIG. 29. The second mask 216 then is removed to form a fundamental CMOS TFT gate structure 222 with the portion 220 acting as an insulating barrier between the n-type area 214 and the p-type area 218, as shown in FIG. 30.

The impurities can be introduced by thermal diffusion or ion implantation. By using thermal diffusion, the impurities are introduced from the surface of the semiconductor layer. By using ion implantation, impurity ions are implanted into the semiconductor layer. The ion implantation method provides a more precise control with respect to the total impurity concentration and depth that the impurities can be implanted into the semiconductor layer, and thus allows impurities to be implanted into a shallow, thin film. Furthermore, ion implantation can be performed at low temperatures. For the above reasons, ion implantation is a preferred technique for introducing impurities into a semiconductor layer in the fabrication process of the TFT.

In the above-described fabrication process of the TFT, impurities are implanted by a conventional ion implantation apparatus using an ion beam having a diameter of only several millimeters. When the ions are to be implanted over a large substrate using the above conventional ion implantation apparatus, it is necessary to either move the substrate mechanically or scan the ion beam electrically over the substrate since the area of the substrate is larger than the diameter of the ion beam. The necessity of having a mechanical moving means for the ion beam causes a problem in that the ion implantation apparatus becomes complicated, large, and expensive.

One technique for solving the above problem, wherein ions can be easily implanted into a large area, is an ion shower-doping method. According to this technique, ions generated by using a plasma discharge are dispersed in a cone shape and accelerated at a low voltage without mass separation to implant in the substrate. Although this technique allows ions to be implanted simultaneously over a large portion of or the entire semiconductor layer, it does not result in uniform implantation.

Once the implantation is complete, the structure is annealed at about 600° C. to activate the impurities. However, the temperature of annealing is detrimental to any temperature-sensitive portion of the entire structure.

Therefore, it would be advantageous to develop a technique to form a CMOS TFT which eliminates the need for introducing impurities during the fabrication of the CMOS TFT, while using state-of-the-art semiconductor device fabrication techniques employing known equipment, process steps, and materials.

SUMMARY OF THE INVENTION

The present invention relates to a method for fabricating a CMOS TFT using doped and activated n-type and p-type polysilicon layers, which eliminates ion implantation and annealing steps used in present methods.

In one embodiment of the present invention, the CMOS TFT is constructed by first coating a base substrate with a layer of oxide. A pre-doped and pre-activated n-type polysilicon layer is applied over the oxide layer. A resist layer is applied to the n-type polysilicon layer such that when the n-type polysilicon layer is etched and the resist layer is removed, n-type regions are formed. An isolation material layer is then applied over the oxide layer and the n-type regions. The isolation material layer is etched such that a portion of the isolation material layer, which resides in the corners formed at the junction between the oxide layer and the n-type regions, forms isolation caps. A pre-doped and pre-activated p-type polysilicon layer is then applied over the oxide layer, n-type region, and isolation caps.

The p-type polysilicon layer is then planarized down to form the p-type regions having a height substantially equal to that of the n-type regions. The p-type regions and the n-type regions are isolated from one another by the isolation caps, hereafter referred to as the isolation barriers. It is, of course, understood that the p-type layer may be applied to the oxide layer prior to applying the n-type layer.

The n-type regions and p-type regions may alternately be formed by again coating a substrate with a layer of oxide. A pre-doped and pre-activated n-type polysilicon layer is applied to the oxide layer. A pad oxide is applied over the n-type polysilicon layer and a nitride layer is applied over the pad oxide to form a layered assembly. A resist layer is patterned on the nitride layer. The layered assembly is etched and the resist layer removed to form an n-type region stack. The nitride layer is then removed and a thin layer of silicon dioxide is formed over the n-type polysilicon layer. A pre-doped and pre-activated p-type polysilicon layer is then applied over the oxide layer and the thin layer of silicon dioxide. The p-type polysilicon layer is then planarized down to the height of the n-type region to form p-type regions, wherein the thin silicon dioxide layer may act as a planarization stop. The p-type and the n-type regions are isolated from one another by the portions of the thin silicon dioxide layer, which become the isolation barriers.

Once the p-type and n-type regions (separated by the isolation barriers) are fabricated, resist masks are formed over each isolation barrier such that open areas are positioned over the n-type regions and the p-type regions. The n-type regions and the p-type regions are then simultaneously etched and the resist masks removed such that the n-type region and the p-type region are each substantially bifurcated into n-type areas and p-type areas, respectively.

A layer of semiconductive, undoped material is disposed over the exposed portions of the oxide layer, the n-type areas, the p-type areas, and the isolation barriers. A layer of insulative material is placed over the semiconductive, undoped material. A layer of metal gate material is then placed over the insulative material layer. A layer of barrier oxide is then disposed over the metal gate material layer.

The barrier oxide layer is masked and etched down to each of the n-type areas, the p-type areas, and the isolation barriers to form gates. An isolation material is applied over the gates, the n-type areas, the p-type areas, and the isolation barriers. The isolation material is etched, leaving end caps abutting edges of the gates.

A layer of passivation material is disposed over the gates, the n-type areas, the p-type areas, and the isolation barriers. The passivation layer is then masked and etched to expose a portion of the n-type areas, the p-type areas, and the isolation barriers.

Poly plugs are disposed within the etched areas in the passivation layer to contact the n-type areas, the p-type areas, and the isolation barriers to form a CMOS TFT structure. Thus, the entire CMOS TFT structure is built with only four mask steps with the n-type and p-type areas being formed by two of these mask steps, which eliminates time-consuming, multiple masking steps required by known fabrication techniques. This, in turn, reduces the cost of manufacturing the CMOS TFT.

As discussed above, the present invention utilizes deposited layers of pre-doped and pre-activated n-type and p-type polysilicon layers. However, it is understood that ion implant steps can be used to vary device characteristics.

Furthermore, it is, of course, understood that, although the present invention is described in terms of a CMOS TFT, the techniques can be applied to other MOS structures such as PMOS and NMOS structures.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
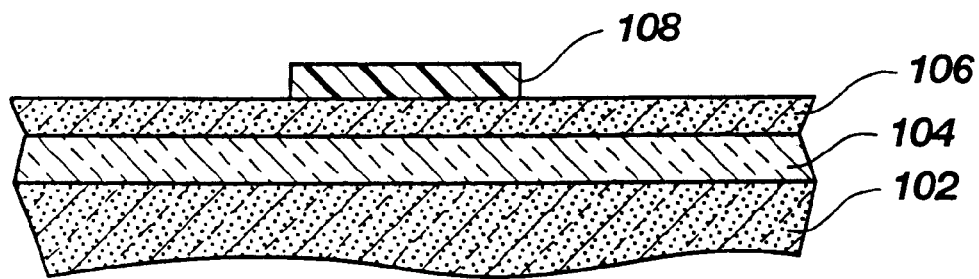
FIGS. 1–15 are side cross-sectional views of a CMOS TFT fabrication technique of the present invention.
Figure 2:
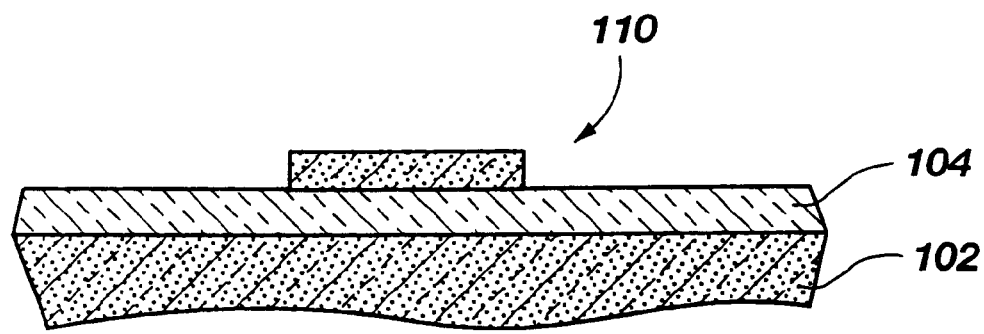
Figure 3:
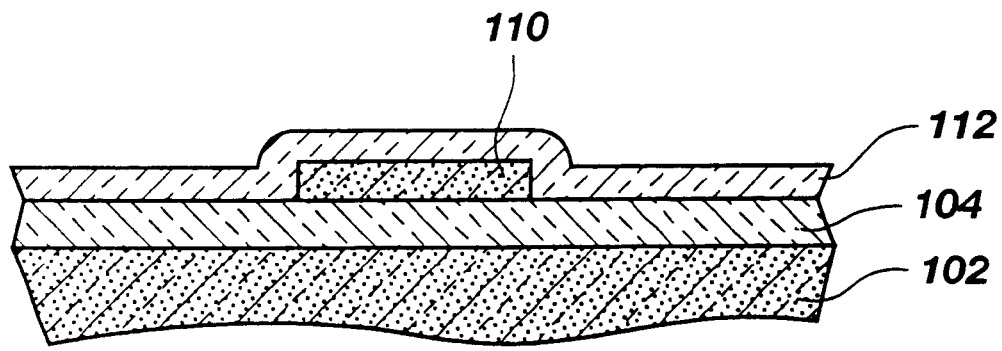
Figure 4:
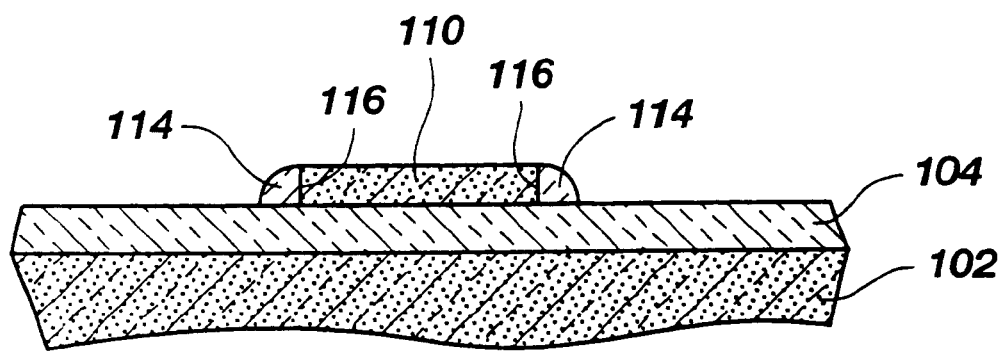
Figure 5:
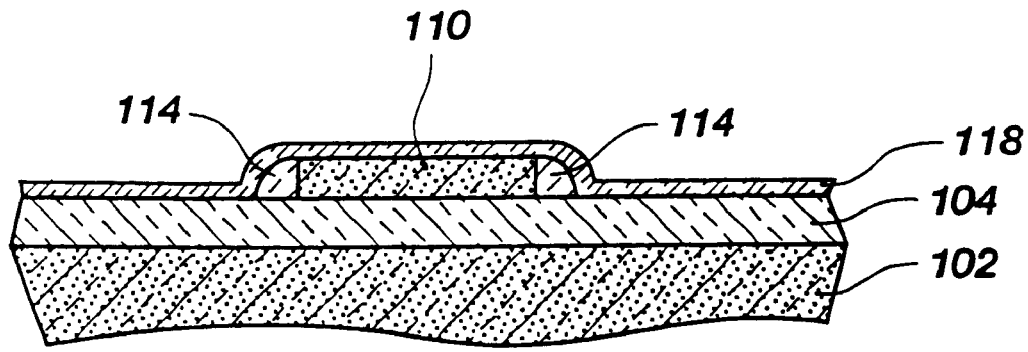
Figure 6:
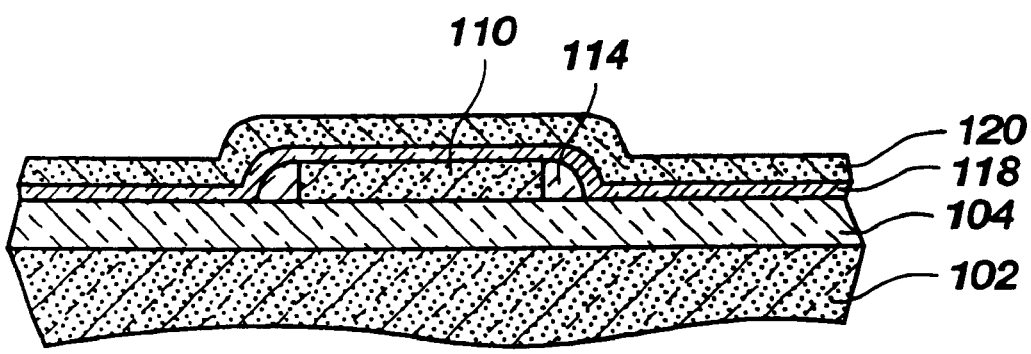

FIGS. 1 through 15 illustrate a preferred method of the present invention for forming a CMOS TFT. As shown in FIG. 1, a base substrate 102, such as a semiconductor substrate, glass substrate, or the like, is coated with a layer of oxide 104, such as silicon dioxide. An n-type polysilicon layer 106, which has previously been doped and activated, is applied to the oxide layer 104. A resist layer 108 is applied to the n-type polysilicon layer 106 in a predetermined pattern. The n-type polysilicon layer 106 is etched and the resist layer 108 removed to form an n-type region 110, as shown in FIG. 2. An isolation material layer 112, preferably silicon dioxide or silicon nitride, is applied over the oxide layer 104 and the n-type region 110, as shown in FIG. 3. The isolation material layer 112 is etched, leaving isolation caps 114 abutting edges 116 of the n-type region 110, as shown in FIG. 4. Optionally, a thin layer of silicon dioxide 118 can be deposited or grown (e.g., by thermal oxidation) over the oxide layer 104, n-type region 110, and isolation caps 114, as shown in FIG. 5. The thin layer of silicon dioxide 118 is used to prevent contamination and act as an etch stop during subsequent processing. A p-type polysilicon layer 120, which has been doped and activated, is then applied over the oxide layer 104, n-type region 110, and isolation caps 114, or over the thin layer of silicon dioxide 118 if formed, as shown in FIG. 6.

Figure 7:
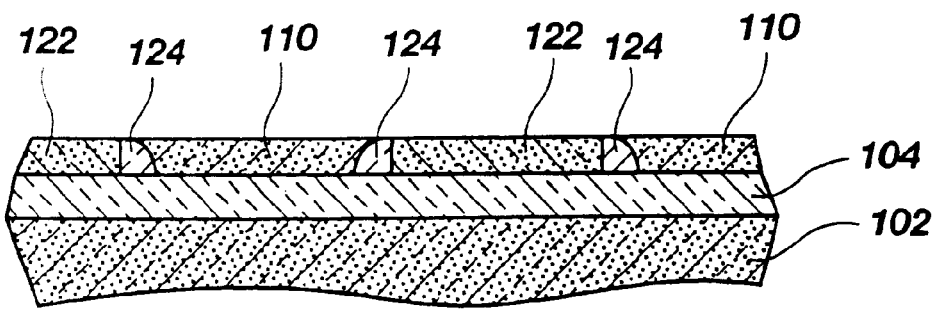

The p-type polysilicon layer 120 is then planarized down to the n-type region 110 wherein the thin silicon dioxide layer 118 may act as a planarization stop. Planarization ensures that the n-type polysilicon layer 106 and the p-type polysilicon layer 120 will be on the same horizontal plane, similar to a twin-tub process. This planarization forms p-type regions 122 and is preferably achieved using an abrasive process such as chemical mechanical planarization ("CMP"). The p-type regions 122 and the n-type region 110 are isolated from one another by the isolation caps 114 and such portions of the thin silicon dioxide layer 118 as may exist. This combination will hereafter be referred to as isolation barriers 124, as shown in FIG. 7.

Figure 20:
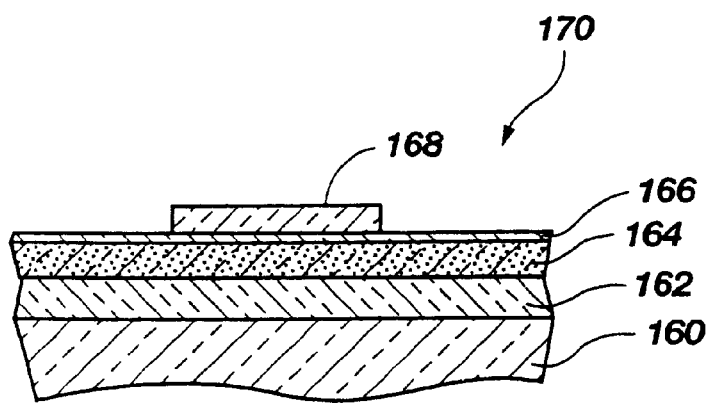
FIGS. 20–25 are side cross-sectional views of a method of forming n-type and p-type regions of the present invention.
Figure 21:
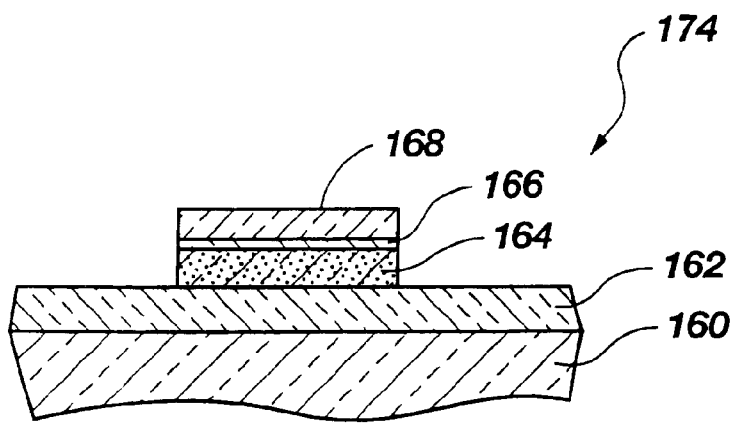
Figure 22:
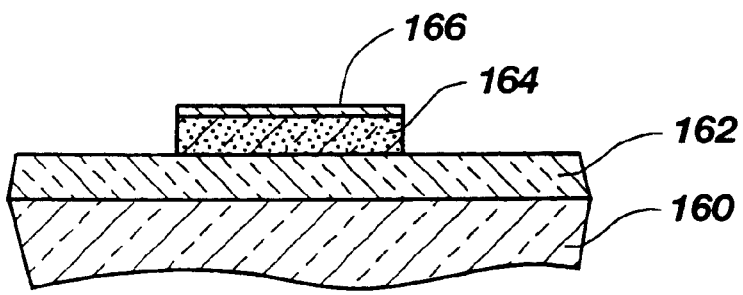
Figure 23:
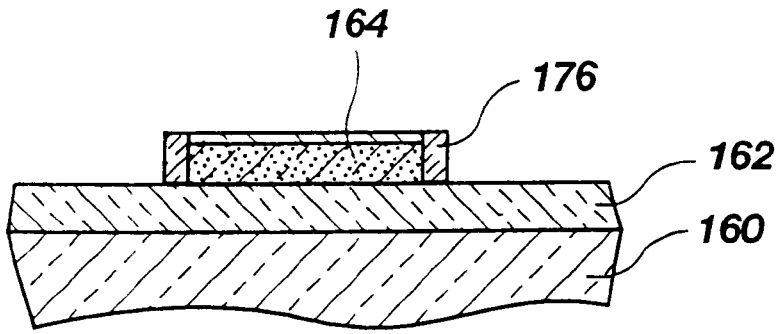
Figure 24:
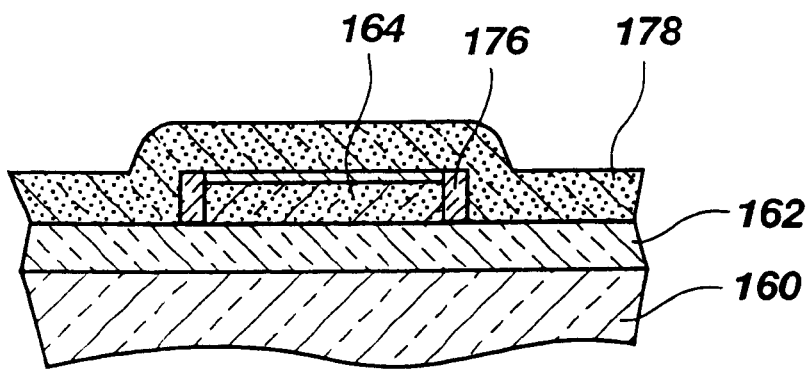

The n-type regions 110 and p-type regions 122 may alternately be formed by the process illustrated in FIGS. 20–25. As shown in FIG. 20, a substrate 160, such as a glass substrate or the like, is coated with a layer of oxide 162. An n-type polysilicon layer 164 which has previously been doped and activated is applied to the oxide layer 162. A pad oxide 166 is applied over the n-type polysilicon layer 164 and a mask layer 168, preferably a nitride layer, is patterned over the pad oxide 166 to form a layered assembly 170. The layered assembly 170 is etched to form an n-type region stack 174, as shown in FIG. 21. The mask layer 168 is removed, as shown in FIG. 22. If the mask layer 168 is a nitride layer, it is preferably removed with phosphoric acid at about 155° C. A thin layer of silicon dioxide 176 can be deposited or grown over the n-type polysilicon layer 164, as shown in FIG. 23. A p-type polysilicon layer 178, which has been doped and activated, is then applied over the oxide layer 162 and the thin layer of silicon dioxide 176, as shown in FIG. 24.

Figure 25:
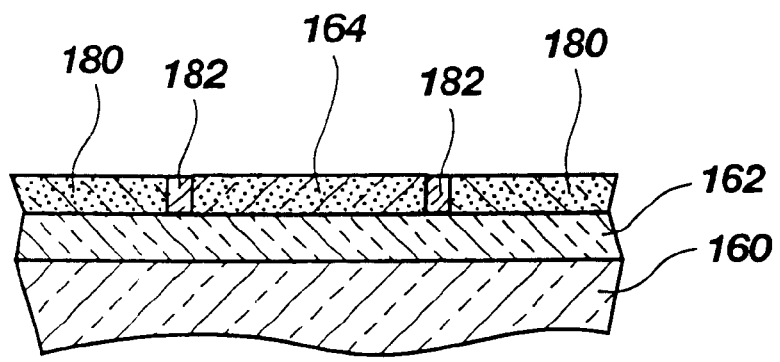
Figure 26:
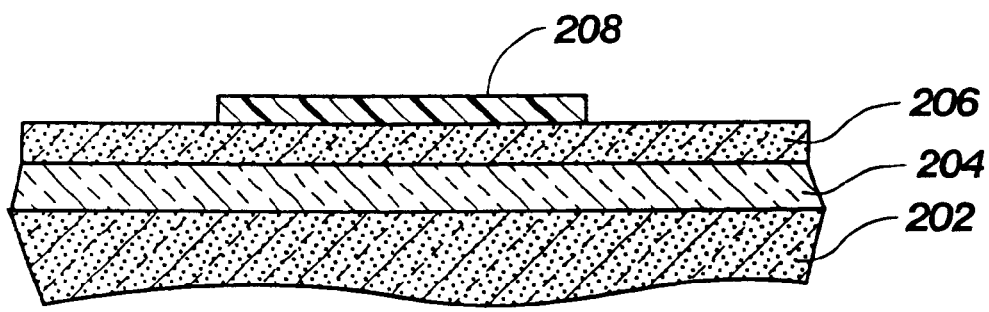
FIGS. 26–30 are side cross-sectional views of a prior art method of fabricating a CMOS TFT.
Figure 27:
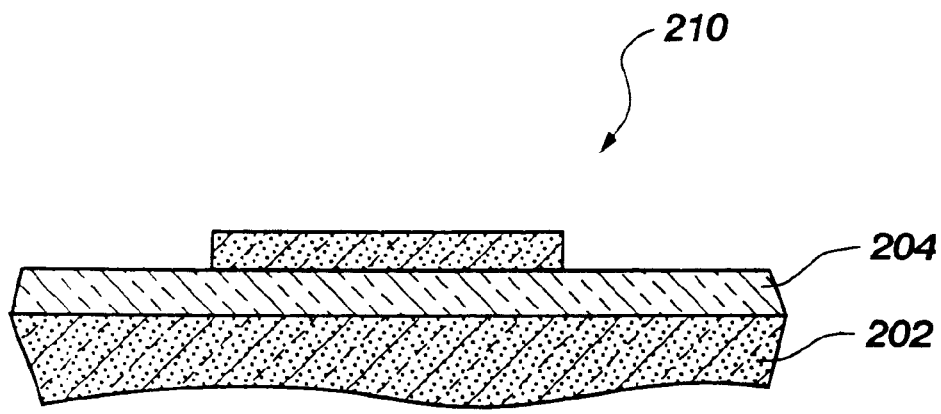
Figure 28:
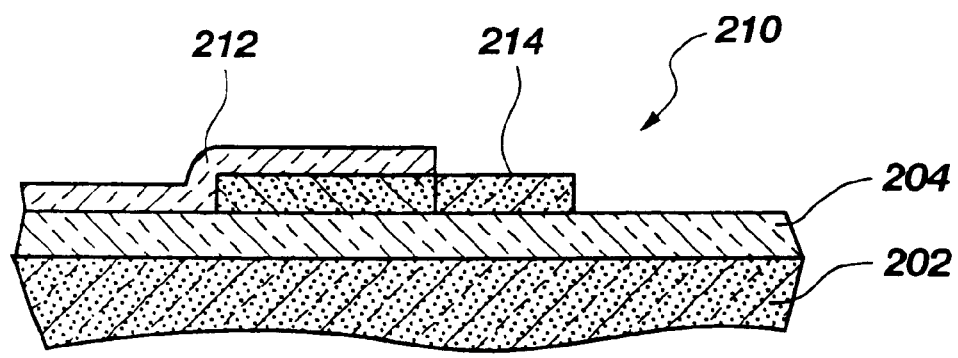
Figure 29:
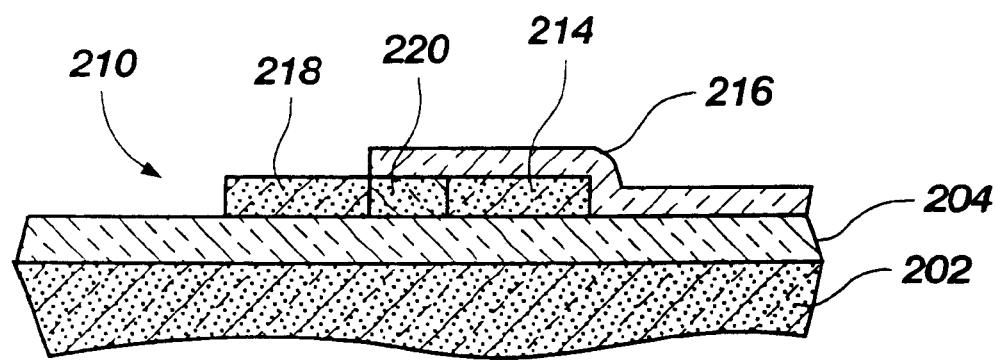
Figure 30:
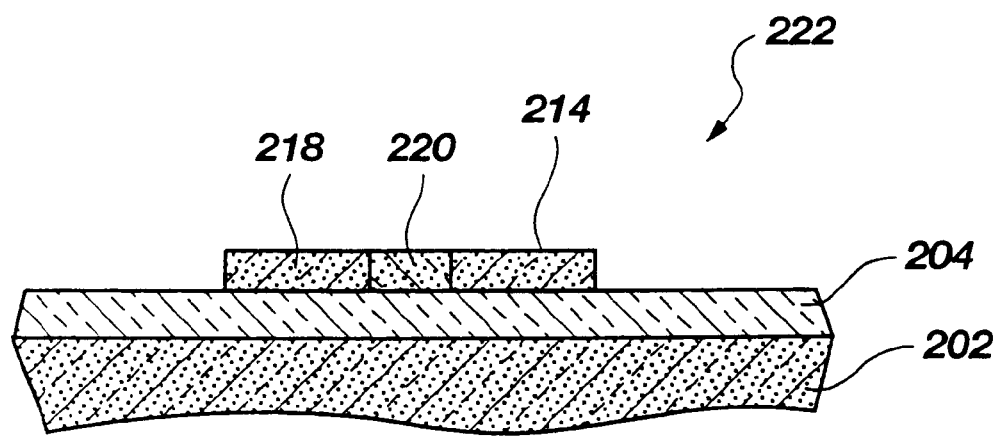

The p-type polysilicon layer 178 is then planarized down to the n-type polysilicon region 164 wherein the thin silicon dioxide layer 176 may act as a planarization stop. This planarization forms p-type regions 180. The p-type regions 180 and the n-type polysilicon region 164 are isolated from one another by non-etched portions 182 of the thin silicon dioxide layer 176, as shown in FIG. 25. It is, of course, understood that the order of forming the n-type polysilicon region 164 and the p-type regions 180 is not important. Thus, the p-type polysilicon layer 178 may be formed first followed by n-type polysilicon layer 164.

Figure 8:
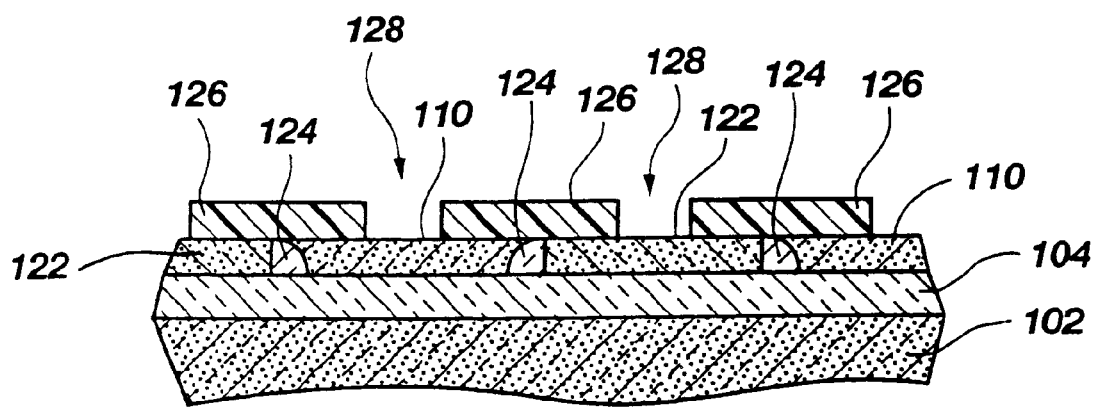
Figure 9:
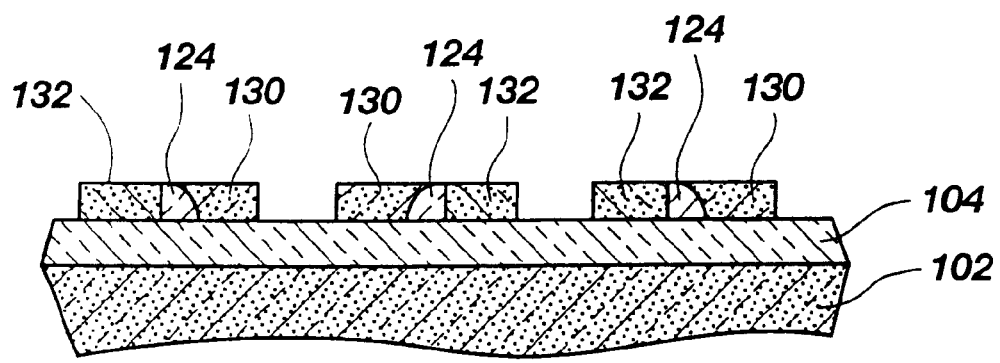

As shown in FIG. 8, once the p-type and n-type regions (separated by the isolation barriers) are fabricated, resist masks 126 are formed over each isolation barrier 124 such that open areas 128 are positioned over the n-type regions 110 and the p-type regions 122. The n-type regions 110 and the p-type regions 122 are simultaneously etched and the resist masks 126 removed to form n-type regions 110 and p-type regions 122 that are each substantially bifurcated into n-type areas 130 and p-type areas 132, as shown in FIG. 9.

Figure 10:
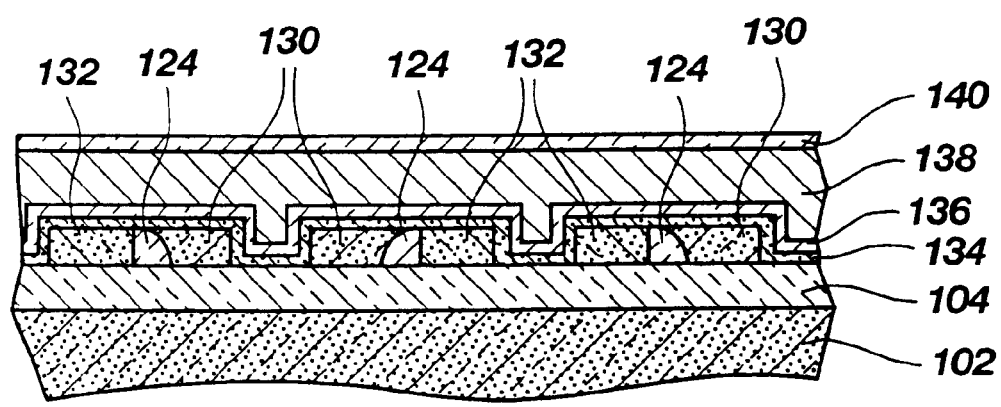

As shown in FIG. 10, a layer of undoped semiconductive material 134, preferably undoped polysilicon, is disposed over the exposed portions of the oxide layer 104, the n-type areas 130, the p-type areas 132, and the isolation barriers 124. A layer of insulative material 136 is placed over the undoped semiconductive material layer 134. A layer of conductive gate material 138 is then placed over the insulative material layer 136. A layer of barrier oxide or nitride 140 is then disposed over the conductive gate material layer 138. The conductive gate material 138 is preferably planarized, such as by CMP, prior to the deposition of the barrier oxide/nitride layer 140. It is, of course, understood that the conductive gate material may be comprised of metal, metal alloys, conductive polymer material, or a layered combination of both.

Figure 11:
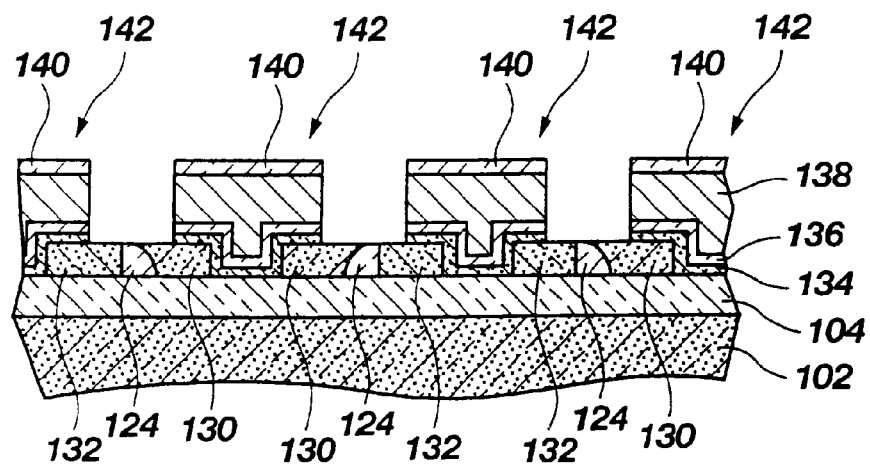
Figure 12:
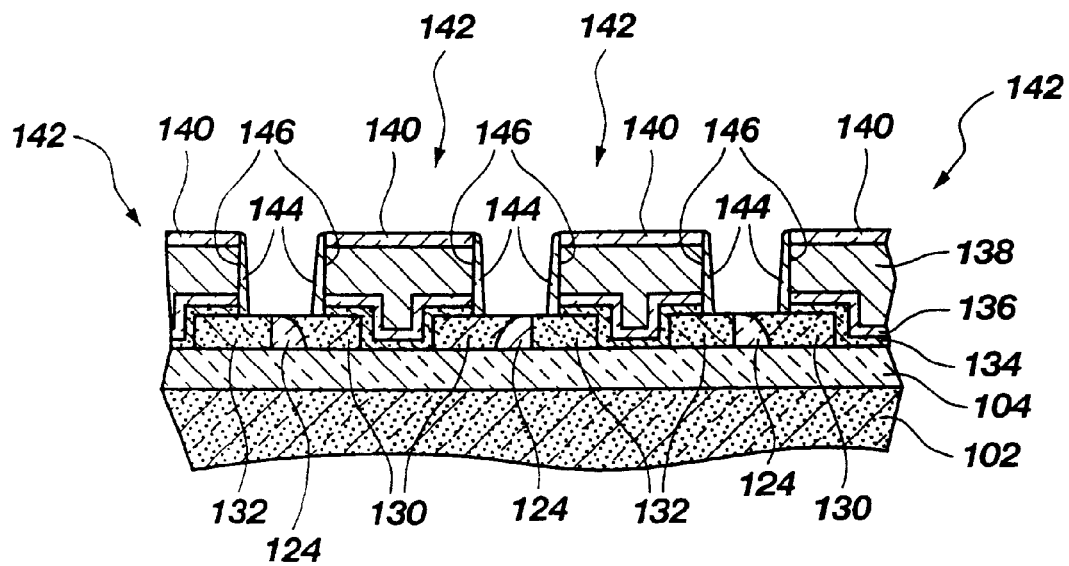

The barrier oxide layer 140 is masked and etched down to each of the n-type areas 130, the p-type areas 132, and the isolation barriers 124, as shown in FIG. 11, to form gates 142. An isolation material (not shown), preferably silicon dioxide or silicon nitride, is applied over the gates 142, the n-type areas 130, the p-type areas 132, and the isolation barriers 124. The isolation material is spacer etched, leaving end caps 144 abutting edges 146 of the gates 142, as shown in FIG. 12.

Figure 13:
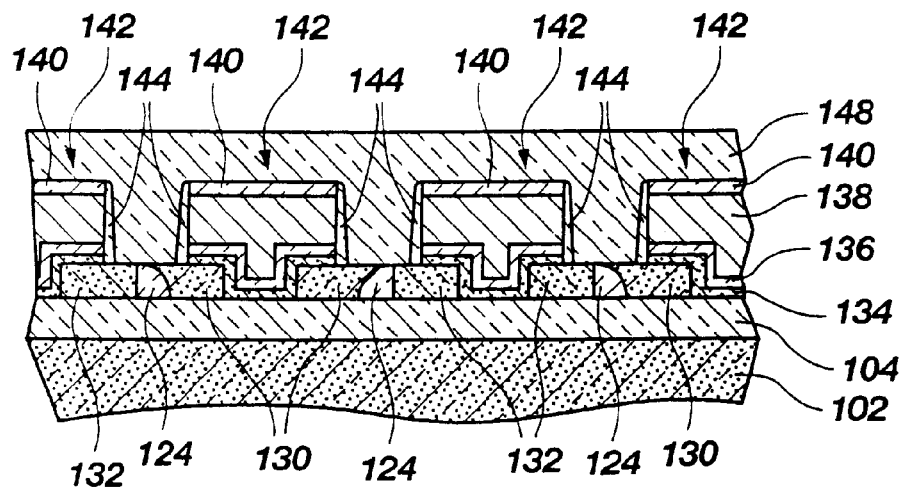
Figure 14:
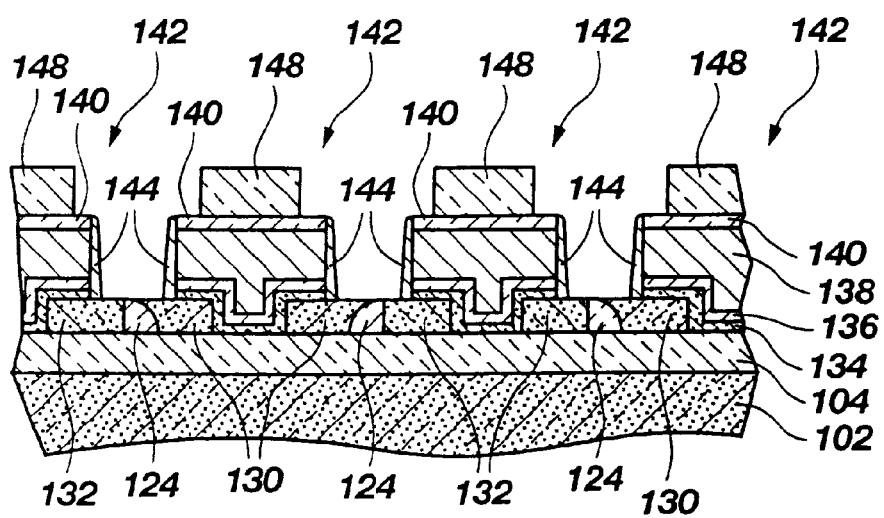

A layer of passivation material 148, such as a low eutectic glass (e.g., borophosphosilicate glass or "BPSG") or other material known in the art, is disposed over the gates 142, the n-type areas 130, the p-type areas 132, and the isolation barriers 124, as shown in FIG. 13. The passivation layer 148 is then masked and etched to exposed a portion of the n-type areas 130, a portion of the p-type areas 132, and the isolation barriers 124, as shown in FIG. 14.

Figure 15:
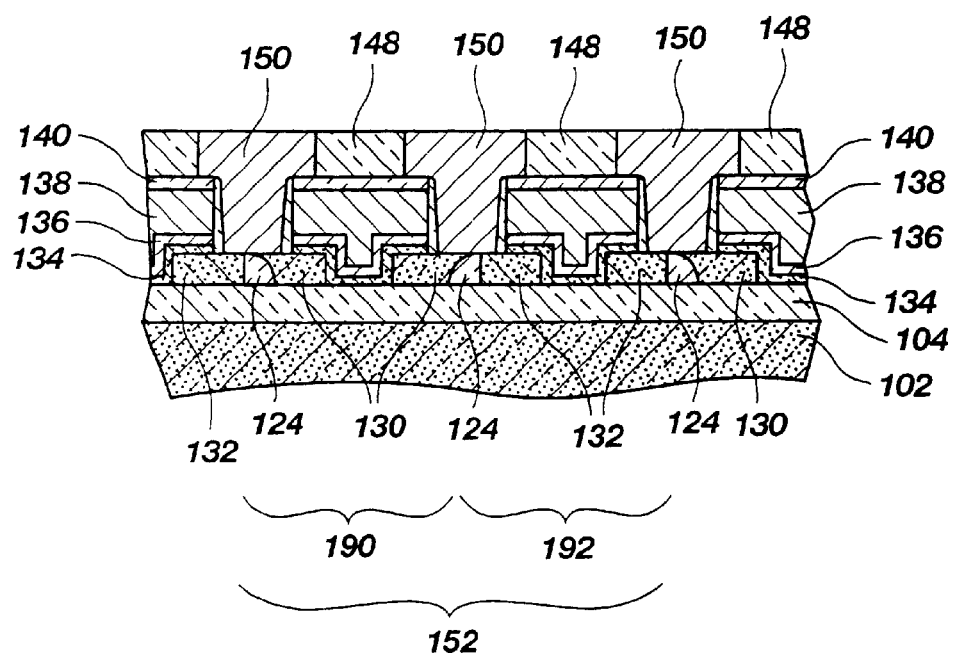
Figure 16:
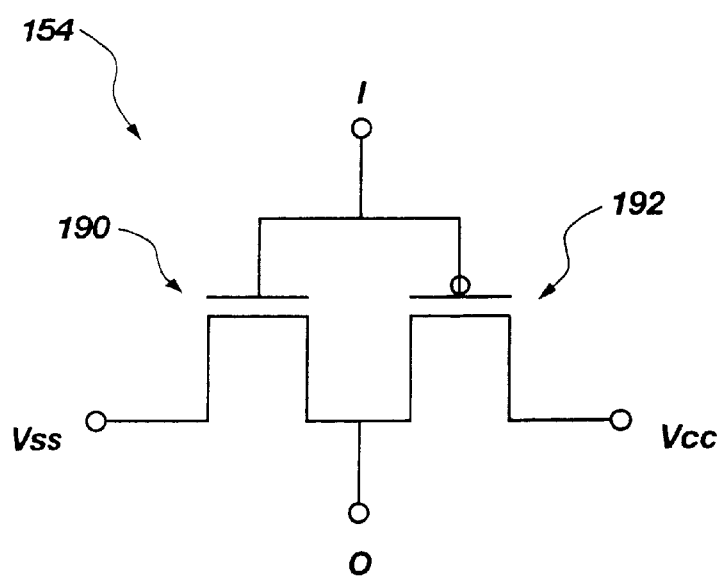
FIG. 16 is an electrical schematic of a CMOS TFT.

As shown in FIG. 15, metal or poly plugs 150, preferably doped polysilicon, are disposed within the etched areas in the passivation layer to contact the n-type areas 130, the p-type areas 132, and the isolation barriers 124, thus forming a CMOS TFT structure 152, which comprises an NMOS (N-type Metal Oxide Semiconductor) section 190 and a PMOS (P-type Metal Oxide Semiconductor) section 192. The CMOS TFT structure 152 forms the CMOS TFT circuit 154 shown in FIG. 16.

Figure 17:
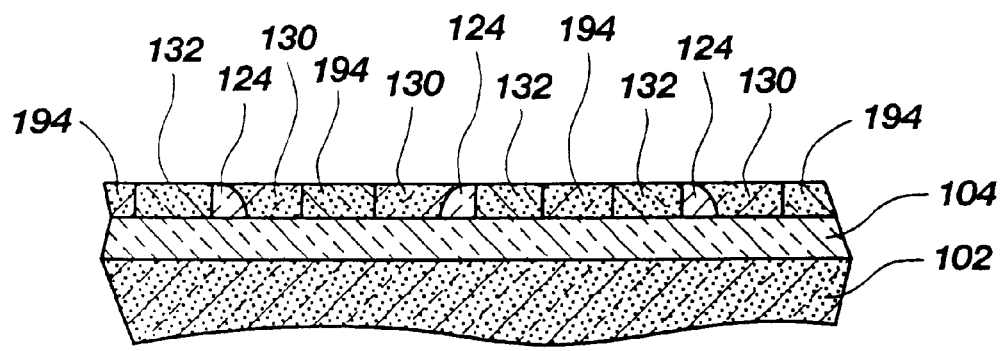
FIGS. 17–19 are side cross-sectional views of an alternate gate formation method for a CMOS-TFT fabrication technique of the present invention.
Figure 18:
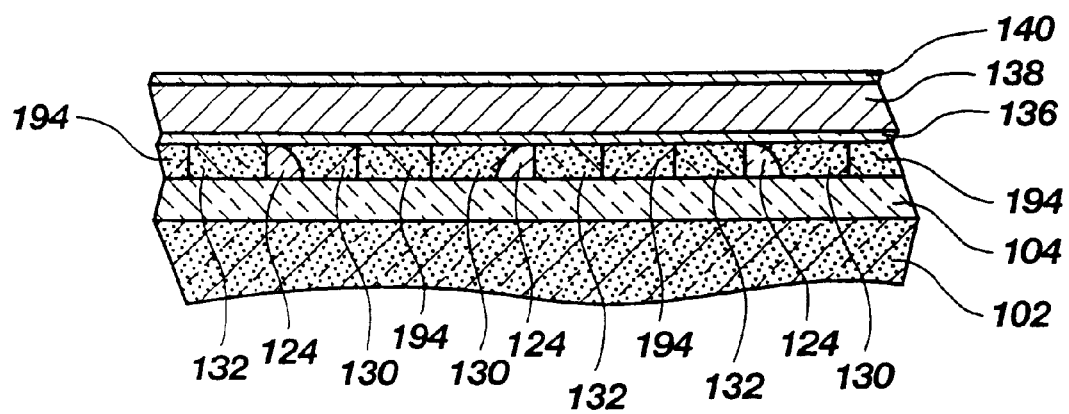
Figure 19:
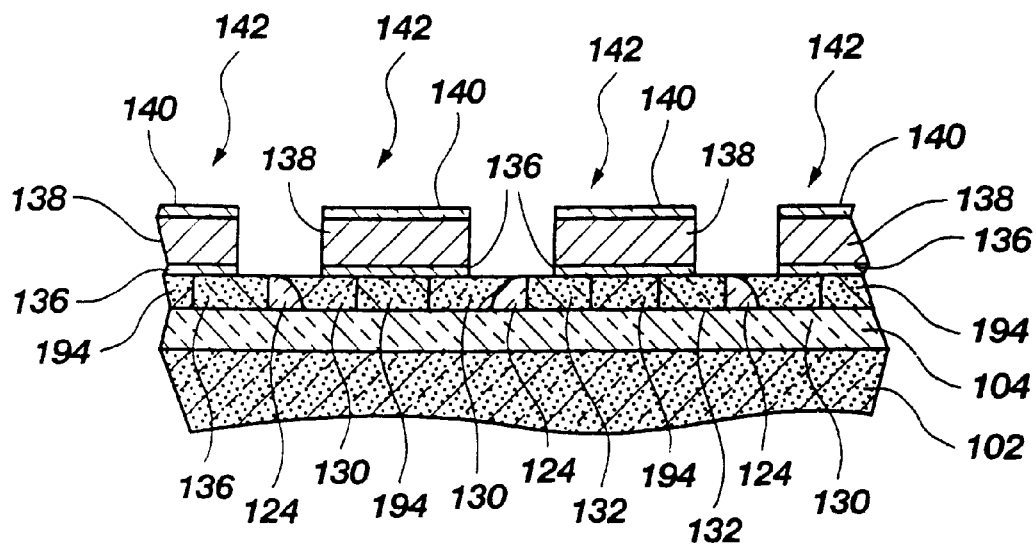

An alternate method for gate fabrication is illustrated in FIGS. 17–19. Elements common between FIGS. 1–15 and FIGS. 17–19 retain the same numeric designation. After the formation of the n-type areas 130 and p-type areas 132 (separated by isolation barriers 124) on the oxide layer 104, as shown in FIG. 9, a layer of undoped semiconductor material is deposited over the structure shown in FIG. 9. The layer of undoped semiconductor material is then planarized to form undoped semiconductor material plugs 194 between the n-type areas 130 and p-type areas 132, as shown in FIG. 17. A layer of insulative material 136 is placed over the undoped semiconductive material plugs 194, the n-type areas 130, the p-type areas 132, and the isolation barriers 124. A layer of conductive gate material 138 is then placed over the insulative material layer 136. A layer of barrier oxide or nitride 140 is then disposed over the conductive gate material layer 138, as shown in FIG. 18. The barrier oxide layer 140 is masked and etched down to each of the n-type areas 130, the p-type areas 132, and the isolation barriers 124, as shown in FIG. 19, to form gates 142. A CMOS TFT is formed from the structure shown in FIG. 19 in a similar manner as illustrated in FIGS. 12–15.

As discussed above, the present invention utilizes deposited layers of pre-doped and pre-activated n-type and p-type polysilicon layers. However, it is understood that the above process can be complimented by ion implant and anneal steps to vary device characteristics.

Having thus described in detail preferred embodiments of the present invention, it is to be understood that the invention defined by the appended claims is not to be limited by particular details set forth in the above description as many apparent variations thereof are possible without departing from the spirit or scope thereof.

It is, of course, understood that the above described technique can be used to form an NMOS TFT by replacing the p-type polysilicon layer 120 with an n-type polysilicon layer and to form a PMOS TFT by replacing the n-type polysilicon layer 106 with a p-type polysilicon layer.

What is claimed is:

1. A method of forming activated areas for a MOS structure, comprising:

providing a substrate having an active surface;

patterning at least one first activated polysilicon area of a first conductivity type on said substrate active surface;

forming at least one isolation barrier abutting said first activated polysilicon area in corners formed at junctions between said at least one first activated polysilicon area and said substrate active surface; and patterning at least one second activated polysilicon area of a second conductivity type and abutting said at least one isolation barrier.

2. The method of claim 1, wherein said substrate active surface includes a layer of oxide thereon.

3. The method of claim 1, wherein said patterning said at least one first activated polysilicon area comprises:

applying a layer of first activated polysilicon over said substrate active surface;

patterning a resist layer on said first activated polysilicon layer;

etching said first activated polysilicon layer to form said at least one first activated polysilicon area; and removing said resist layer.

4. The method of claim 1, wherein said forming said at least one isolation barrier comprises:

applying an isolation material layer over said substrate and said at least one first activated polysilicon area; and etching said isolation material layer such that a portion of said isolation material layer remains in said corners at junctions between said substrate and said at least one first activated polysilicon area.

5. The method of claim 1, wherein said patterning said at least one first activated polysilicon area and said forming said at least one isolation barrier comprise:

applying a layer of first activated polysilicon of a first conductivity type over said substrate active surface;

applying a pad oxide over said layer of first activated polysilicon;

applying a nitride layer over said pad oxide;

patterning a resist layer on said nitride layer;

etching said nitride layer, said pad oxide, and said layer of first activated polysilicon to form said at least one first activated polysilicon area;

removing said resist layer;

removing said nitride layer; and forming an isolation material layer over said layer of first activated polysilicon wherein a portion of said isolation material layer abutting said corners at junctions between said substrate active surface and said at least one first activated polysilicon area forms said at least one isolation barrier.

6. The method of claim 1, wherein patterning said at least one second activated polysilicon area comprises:

applying a layer of second activated polysilicon of said second conductivity type over said substrate active surface, said at least one isolation barrier, and said at least one first activated polysilicon area; and planarizing said layer of second activated polysilicon to form said at least one second polysilicon area by separating said layer of first activated polysilicon from said layer of second activated polysilicon by said at least one isolation barrier.

7. The method of claim 1, further comprising doping said at least one first activated polysilicon area to have a p-type conductivity.

8. The method of claim 1, further comprising doping said at least one first activated polysilicon area to have an n-type conductivity.

9. The method of claim 1, further comprising doping said at least one second activated polysilicon area to have a p-type conductivity.

10. The method of claim 1, further comprising doping said at least one second activated polysilicon area to have an n-type conductivity.

11. A method of forming activated areas for a MOS structure, comprising:

providing a substrate having an active surface;

forming at least one first activated polysilicon area of a first conductivity type on said substrate active surface;

forming at least one isolation barrier laterally adjacent said at least one first activated polysilicon area; and forming at least one second activated polysilicon area of a second conductivity type adjacent said at least one isolation barrier.

12. The method of claim 11, wherein said forming said at least one second activated polysilicon area comprises electrically isolating said at least one second activated polysilicon area from said at least one first activated polysilicon area.

13. The method of claim 11, wherein said forming said at least one first activated polysilicon area comprises:

disposing a first activated polysilicon layer over said substrate active surface;

disposing a mask on said first activated polysilicon layer; and removing regions of said first activated polysilicon layer through said mask.

14. The method of claim 11, wherein said forming said at least one isolation barrier comprises:

applying an isolation material layer over said substrate active surface and said at least one first activated polysilicon area; and removing regions of said isolation material layer such that a portion of said isolation material layer remains laterally adjacent said at least one first activated polysilicon area.

15. The method of claim 11, wherein said forming said at least one first activated polysilicon area and said forming said at least one isolation barrier comprise:

applying a layer of first activated polysilicon of a first conductivity type over said substrate active surface;

applying a pad oxide over said first activated polysilicon layer;

applying a nitride layer over said pad oxide;

patterning a resist layer on said nitride layer;

etching said nitride layer, said pad oxide, and said layer of first activated polysilicon to form said at least one first activated polysilicon area;

removing said resist layer;

removing said nitride layer;

forming an isolation material layer over said layer of first activated polysilicon wherein a portion of said isolation material layer abutting corners at junctions between said substrate active surface and said at least one first activated polysilicon area forms said at least one isolation barrier; and forming resist masks over said at least one isolation barrier such that said at least one first activated polysilicon area and said at least one second activated polysilicon area consists of an open area.

16. The method of claim 15, wherein said forming said at least one first and said at least one second activated polysilicon areas comprises:

substantially simultaneously etching said at least one first activated polysilicon area and said at least one second activated polysilicon area;

removing said resist masks from said at least one first activated polysilicon area and from said at least one second activated polysilicon area so as to bifurcate said at least one first activated polysilicon area from said at least one second activated polysilicon area;

fabricating at least one gate comprising semiconductive material over said at least one first activated polysilicon area, said at least one second polysilicon area, and said at least one isolation barrier; and disposing a passivation layer over said at least one gate.

17. The method of claim 11, further comprising doping said at least one first activated polysilicon area to have a p-type conductivity.

18. The method of claim 11, further comprising doping said at least one first activated polysilicon area to have an n-type conductivity.

19. The method of claim 11, further comprising doping said at least one second activated polysilicon area to have a p-type conductivity.

20. The method of claim 11, further comprising doping said at least one second activated polysilicon area to have an n-type conductivity.

* * * * *

UNITED STATES PATENT AND TRADEMARK OFFICE
CERTIFICATE OF CORRECTION

PATENT NO. : 6,140,160  
DATED : October 31, 2000  
INVENTOR(S) : Salman Akram

Page 1 of 1

It is certified that error appears in the above-identified patent and that said Letters Patent is hereby corrected as shown below:

Title page,  
Item [56], References Cited, U.S. PATENT DOCUMENTS, change "5,719,429" to -- 5,719,426 --.

Item [57], ABSTRACT,  
Line 3, after "n-type" change "and" to -- or --.

Column 2,  
Line 30, after "of" delete "or"

Column 5,  
Line 60, change "exposed" to -- expose --  
Line 65, after "layer" insert -- 148 --

Signed and Sealed this

Fourth Day of February, 2003

JAMES E. ROGAN  
*Director of the United States Patent and Trademark Office*